United States Patent
Johansson et al.

(10) Patent No.: US 9,907,034 B2
(45) Date of Patent: Feb. 27, 2018

(54) GAIN CONTROL IN RADIO CHAINS OF A RECEIVER

(71) Applicant: Telefonaktiebolaget LM Ericsson (publ), Stockholm (SE)

(72) Inventors: Bernt Johansson, Värmdö (SE); Jan-Erik Thillberg, Stockholm (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 15/322,962

(22) PCT Filed: Jul. 3, 2014

(86) PCT No.: PCT/SE2014/050854
§ 371 (c)(1),
(2) Date: Dec. 29, 2016

(87) PCT Pub. No.: WO2016/003341
PCT Pub. Date: Jan. 7, 2016

(65) Prior Publication Data
US 2017/0164305 A1    Jun. 8, 2017

(51) Int. Cl.
*H04B 7/00* (2006.01)
*H04W 52/52* (2009.01)
*H04B 1/10* (2006.01)
*H04B 7/0413* (2017.01)

(52) U.S. Cl.
CPC ............ *H04W 52/52* (2013.01); *H04B 1/10* (2013.01); *H04B 7/0413* (2013.01)

(58) Field of Classification Search
CPC ................................ H04W 52/52; H04B 1/10

USPC ....................................................... 455/234.1
See application file for complete search history.

(56) References Cited

U.S. PATENT DOCUMENTS

| 5,263,180 | A  | * | 11/1993 | Hirayama | H04B 7/084 455/139 |
| 5,488,379 | A  | * | 1/1996  | Jackson  | H01Q 3/005 342/359 |
| 7,929,985 | B2 | * | 4/2011  | Khayrallah | H04B 7/0877 455/550.1 |
| 8,457,261 | B1 |   | 6/2013  | Shi et al. | |
| 8,743,914 | B1 |   | 6/2014  | Jensen | |
| 2005/0277423 | A1 | | 12/2005 | Sandhu et al. | |
| 2006/0050817 | A1 | * | 3/2006 | Kanemoto | H03G 3/3052 375/347 |

(Continued)

FOREIGN PATENT DOCUMENTS

| EP | 2037594 A2 | 3/2009 |
| WO | 2005060574 A2 | 7/2005 |

*Primary Examiner* — Sanh Phu
(74) *Attorney, Agent, or Firm* — Murphy, Bilak & Homiller, PLLC (57) ABSTRACT

There is provided automatic gain control of radio chains of a receiver. At least two radio frequency (RF) signals are received. Each RF signal is received on an individual radio chain from an antenna array. By comparing the at least two RF signals to a threshold it is determined whether to perform gain control or not of at least one of the at least two RF signals before analog combining of the at least two RF signals. A notification is sent to a detector regarding whether gain control is performed or not. Analog combining of the at least two RF signals is performed, thereby generating a single input to the detector.

22 Claims, 5 Drawing Sheets

(56) References Cited

U.S. PATENT DOCUMENTS

2011/0109507 A1    5/2011   Warnick
2013/0322559 A1   12/2013   Kludt et al.
2013/0322574 A1   12/2013   Chen et al.
2014/0146863 A1    5/2014   Seol et al.

\* cited by examiner

GAIN CONTROL IN RADIO CHAINS OF A RECEIVER

TECHNICAL FIELD

Embodiments presented herein relate to automatic gain control, and particularly to a method, a receiver, a computer program, and a computer program product for automatic gain control of radio chains of a receiver.

BACKGROUND

In communications networks, there may be a challenge to obtain good performance and capacity for a given communications protocol, its parameters and the physical environment in which the communications network is deployed.

For example, one parameter in providing good performance and capacity for a given communications protocol in a communications network is the capabilities of the radio transceiver devices operating in the communications network. Examples of such radio transceiver devices include both radio access network nodes and portable wireless devices. For example, the radio transceiver devices comprise receivers in order to receive signals from another radio transceiver device or node in the communications network.

As is known by the skilled person, a receiver in a radio transceiver device comprises circuitry configured to perform operations on received signals. One such operation is gain control, or automatic gain control (AGC).

AGC currently exist in radio access network nodes with antennas where the different antenna signal chains are independent of each other. Current radio access network nodes are based on a receiver architecture where there typically are a low number of parallel receiver branches (say, about 2-4) with separate detectors and control loops in each receiver branch. Such an antenna architecture is not possible to implement in an array antenna system using combining before detection.

More particularly, in antenna array systems with a large number of antennas (say, more than 4 antennas), each antenna is connected to low noise amplifiers and then combined into one received signal. In this combined received signal distributed to a detector it is not possible to control the individual antenna signal paths based on the combined received signal at the detector. It is not possible to detect if the signal in one path is saturated and thus distort the combined received signal.

Hence, there is still a need for an improved gain control in a receiver in a radio transceiver device.

SUMMARY

An object of embodiments herein is to provide improved gain control in a receiver in a radio transceiver device.

A particular object of embodiments herein is to provide improved gain control in a receiver in a radio transceiver device where the receiver uses analogue combined beam forming.

According to a first aspect there is presented a method for automatic gain control of radio chains of a receiver. The method is performed by a controller. The method comprises receiving at least two radio frequency (RF) signals. Each RF signal being received on an individual radio chain from an antenna array. The method comprises determining, by comparing the at least two RF signals to a threshold, whether to perform gain control or not of at least one of the at least two RF signals before analogue combining of the at least two RF signals. The method comprises sending a notification to a detector regarding whether gain control is performed or not. The method comprises performing analogue combining of the at least two RF signals, thereby generating a single input to the detector.

Advantageously this provides efficient gain control in a receiver in radio transceiver device.

Advantageously this provides efficient gain control in a receiver in radio transceiver device where the receiver uses analogue combined beam forming.

Advantageously this enables the number of signals between the receiver and the gain control to be reduced from many to one without affecting the gain control functionality in the receiver.

According to a second aspect there is presented a computer program for automatic gain control of radio chains of a receiver, the computer program comprising computer program code which, when run on a processing unit, causes the processing unit to perform a method according to the first aspect.

According to a third aspect there is presented a computer program product comprising a computer program according to the second aspect and a to computer readable means on which the computer program is stored.

According to a fourth aspect there is presented a receiver for automatic gain control of radio chains of a receiver. The receiver comprises a processing unit. The processing unit is configured to receive at least two radio frequency (RF) signals. Each RF signal being received on an individual radio chain from an antenna array. The processing unit is configured to determine, by comparing the at least two RF signals to a threshold, whether to perform gain control or not of at least one of the at least two RF signals before analogue combining of the at least two RF signals. The processing unit is configured to send a notification to a detector regarding whether gain control is performed or not. The processing unit is configured to perform analogue combining of the at least two RF signals, thereby generating a single input to the detector.

Advantageously such a receiver may be combined with an antenna array used for beam-forming in the analog domain and where the detector is integrated in a chip with many antenna receiving elements, e.g., so-called massive multiple-input multiple-output (MIMO). Massive MIMO is in the literature also known as Large-Scale Antenna Systems.

According to a fifth aspect there is presented a radio access network node for automatic gain control of radio chains of a receiver of the radio access network node. The radio access network node comprises an antenna array. The radio access network node comprises a detector. The radio access network node comprises a receiver according to the fourth aspect.

According to a fifth aspect there is presented a portable wireless device for automatic gain control of radio chains of a receiver of the portable wireless device. The portable wireless device comprises an antenna array. The portable wireless device comprises a detector. The portable wireless device comprises a receiver according to the fourth aspect.

It is to be noted that any feature of the first, second, third, fourth, fifth and sixth aspects may be applied to any other aspect, wherever appropriate. Likewise, any advantage of the first aspect may equally apply to the second, third, fourth, fifth, and/or sixth aspect, respectively, and vice versa. Other objectives, features and advantages of the enclosed embodiments will be apparent from the following detailed disclosure, from the attached dependent claims as well as from the drawings.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated.

BRIEF DESCRIPTION OF THE DRAWINGS

The inventive concept is now described, by way of example, with reference to the accompanying drawings, in which.

DETAILED DESCRIPTION

The inventive concept will now be described more fully hereinafter with reference to the accompanying drawings, in which certain embodiments of the inventive concept are shown. This inventive concept may, however, be embodied in many different forms and should not be construed as limited to the embodiments set forth herein; rather, these embodiments are provided by way of example so that this disclosure will be thorough and complete, and will fully convey the scope of the inventive concept to those skilled in the art. Like numbers refer to like elements throughout the description. Any step or feature illustrated by dashed lines should be regarded as optional.

In general terms, in existing receivers in radio access network nodes and portable wireless devices the RF signal from one separate receiver branch is transformed to baseband and then converted into a digital signal by an analog-to-digital converter (ADC). The digital signal is then monitored and it is determined if a gain change of the signal is needed or not. The monitoring and gain change are typically performed independently in each receiver branch in receivers with multiple receiver branches. In some cases the gain changes are determined by measuring on one or more receiver branches and then gain changes are set in all receiver branches.

Figure 1:
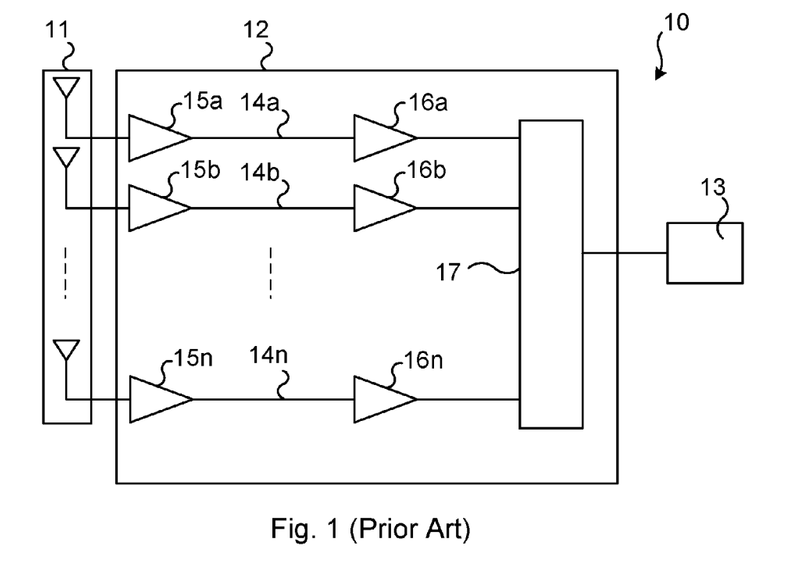
FIG. 1 is a schematic diagram illustrating a radio signal processing arrangement according to prior art.

In the case of receivers in radio access network nodes and portable wireless devices having array antenna systems using analog RF combining these methods are not applicable. Each antenna element, or sub-array of antenna elements in the antenna array, are connected to a low noise amplifier and then combined into one received RF signal connected to a detector. FIG. 1 is a schematic diagram illustrating such a known radio signal processing arrangement 10. The radio signal processing arrangement 10 comprises an antenna array 11, a receiver 12, and a detector 13.

The antenna array 11 is configured to receive radio frequency (RF) signals on individual antenna elements and to provide the received RF signals to the receiver 12. The antenna array 11 comprises n receiver chains.

The receiver 12 comprises radio chains 14a, 14b, ..., 14n on which RF signals from the antenna array 11 are received. The receiver 12 further comprises low noise amplifiers (LNAs) 15a, 15b, ..., 15n. An LNA 15a, 15b, ..., 15n is provided along each radio chain 14a, 14b, ..., 14n. The LNAs 15a, 15b, ..., 15n are configured for low noise amplification of the RF signals on the radio chains 14a, 14b, ..., 14n.

The receiver 12 may comprises optional individual gain elements 16a, 16b, ..., 16n. An individual gain element 16a, 16b, ..., 16n may thus be provided along each radio chain 14a, 14b, ..., 14n after the LNAs 15a, 15b, ..., 15n along the radio chains 14a, 14b, ..., 14n. The individual gain elements 16a, 16b, ..., 16n may be configured for individual gain control of the RF signals on the radio chains 14a, 14b, ..., 14n. The individual gain elements 16a, 16b, ..., 16n may have fixed gain values.

The receiver 12 comprises an analogue combiner 17. The analogue combiner 17 is configured for analogue combining of the RF signals. The analogue combiner 17 combines the RF signals into one signal which is provided to the detector 13.

All signals are thus combined before distributed to the detector 13. It will therefore not be possible to, for the radio signal processing arrangement 10, determine in a detected signal from which path any gain problem has occurred. It will thus not, for the radio signal processing arrangement 10, be possible to determine how to provide a compensated gain and which receiver branch (i.e., which radio chain 14a, 14b, ... 14n) to compensate.

A first possible way to adapt the radio signal processing arrangement 10 to larger antenna arrays 11 (corresponding to many individual antenna elements), for example in order to make the radio signal processing arrangement 10 suitable for so-called massive multiple-input multiple-output (MIMO) could be to scale the radio signal processing arrangement 10. However, this may be expensive. A second possible way to adapt the radio signal processing arrangement 10 to larger antenna arrays 11 could be to re-build the known radio signal processing arrangement 10 and change the architecture of the gain elements. Currently, automatic gain control is performed based on measurements made in the digital domain. Hence, the first possible way and the second possible way are not readily combinable.

Figure 2:
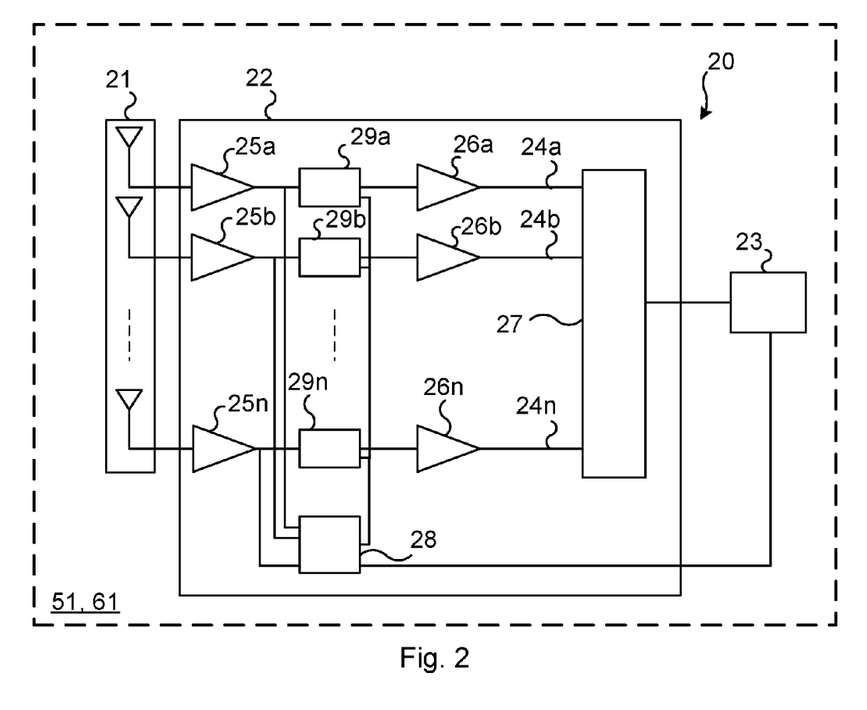
FIG. 2 is a schematic diagram illustrating a radio signal processing arrangement according to embodiments.

FIG. 2 is a schematic diagram illustrating a radio signal processing arrangement 20 where embodiments presented herein can be applied. The radio signal processing arrangement 20 comprises an antenna array 21, a receiver 22, and a detector 23.

The functionalities of the antenna array 21, the receiver 22, and the detector 23 correspond to the functionalities of the antenna array 11, the receiver 12, and the detector 13 of the radio signal processing arrangement 10 in FIG. 1, except that the receiver 22 further comprises a controller 28 and gain control elements 29a, 29b, ..., 29n controlled by the controller 28.

The antenna array 21 is thus configured to receive radio frequency (RF) signals on individual antenna elements and to provide the received RF signals to the receiver 22. The antenna array 21 comprises n receiver chains.

The receiver 22 thus comprises radio chains 24a, 24b, ..., 24n on which RF signals from the antenna array 21 are received. The receiver 22 further comprises low noise amplifiers (LNAs) 25a, 25b, ..., 25n. An LNA 25a, 25b, ..., 25n is provided along each radio chain 24a, 24b, ..., 24n. The LNAs 25a, 25b, ..., 25n are configured for low noise amplification of the RF signals on the radio chains 24a, 24b, ..., 24n. In FIG. 2 the LNAS 25a, 25b, ..., 25n are provided between the antenna array 21 and gain control elements 29a, 29b, ..., 29n (see below) along the radio chains 24a, 24b, ..., 24n. However, the LNAS 25a, 25b, ..., 25n may alternatively be provided between the gain control elements 29a, 29b, ..., 29n and individual gain element 26a, 26b, ..., 26n (see below) along the radio chains 24a, 24b, ..., 24n.

The receiver 22 further comprises gain control elements 29a, 29b, ..., 29n. The gain control elements 29a, 29b, ..., 29n are controlled by a controller 28. In general terms, a new function block in terms of a controller 28 may thus be added to the radio signal processing arrangement 20, where the controller 28 is operatively connected to the RF signal on each radio chain 24a, 24b, ..., 24n. The controller 28 is operatively connected to the RF signal on each radio chain 24a, 24b, ..., 24n before the gain control elements 29a, 29b, ..., 29n, the individual gain elements 26a, 26b, ..., 26n and the analogue combiner 27. The controller 28 may thus detect the RF signal before the gain control elements 29a, 29b, ..., 29n and the optional individual gain elements 26a, 26b, ..., 26n affect the RF signals. In brief, the controller 28 detects if any of the RF signals crosses a threshold and based on this determines if gain control should be performed or not by activating or deactivating the gain control elements 29a, 29b, ..., 29n. For example, the controller 28 may control all gain control elements 2929a, 29b, ..., 29n with one control signal, setting the gain control on or off. The controller 28 indicates to the detector 23 whether gain control (of the gain control elements 29a, 29b, ..., 29n) is activated or not. Hence the controller 28 may have a communications interface to the detector 23. Further detailed disclosure of the gain control elements 29a, 29b, ..., 29n and the controller 28 will be provided below.

The receiver 22 may thus further comprises individual gain elements 26a, 26b, ..., 26n. An individual gain element 26a, 26b, ..., 26n may be provided along each radio chain 24a, 24b, ..., 24n after the gain control elements 29a, 29b, ..., 29n along the radio chains 24a, 24b, ..., 24n. The individual gain elements 26a, 26b, ..., 26n may be configured for further individual gain control of the RF signals on the radio chains 24a, 24b, ..., 24n. The individual gain elements 29a, 29b, ..., 29n may have fixed gain values.

The receiver 22 thus comprises an analogue combiner 27. The analogue combiner 27 is configured for analogue combining of the RF signals. The analogue combiner 27 combines the RF signals into one signal which is provided to the detector 23.

The embodiments disclosed herein relate to automatic gain control of radio chains of a receiver. In order to obtain automatic gain control of radio chains of a receiver there is provided a receiver, a method performed by the receiver, a computer program comprising code, for example in the form of a computer program product, that when run on a processing unit, causes the processing unit to perform the method.

Figure 3A:
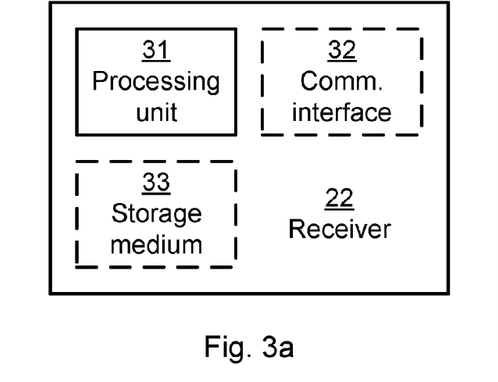
FIG. 3a is a schematic diagram showing functional units of a controller according to an embodiment.

FIG. 3a schematically illustrates, in terms of a number of functional units, the components of a receiver 22 according to an embodiment. A processing unit 31 is provided using any combination of one or more of a suitable central processing unit (CPU), multiprocessor, microcontroller, digital signal processor (DSP), application specific integrated circuit (ASIC), field programmable gate arrays (FPGA) etc., capable of executing software instructions stored in a computer program product 41 (as in FIG. 4), e.g. in the form of a storage medium 33. Thus the processing unit 31 is thereby arranged to execute methods as herein disclosed. The storage medium 33 may also comprise persistent storage, which, for example, can be any single one or combination of magnetic memory, optical memory, solid state memory or even remotely mounted memory. The receiver 22 may further comprise a communications interface 32 for communications with the antenna array 21 and the detector 23. The processing unit 31 controls the general operation of the receiver 22 e.g. by sending data and control signals to the communications interface 32 and the storage medium 33, by receiving data and reports from the communications interface 32, and by retrieving data and instructions from the storage medium 33. Other components, as well as the related functionality, of the receiver 22 are omitted in order not to obscure the concepts presented herein.

Figure 3B:
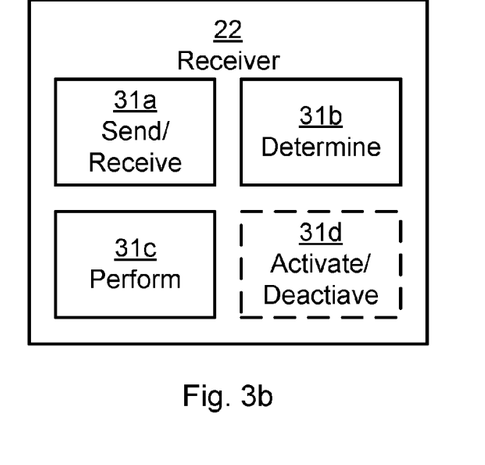
FIG. 3b is a schematic diagram showing functional modules of a controller according to an embodiment.

FIG. 3b schematically illustrates, in terms of a number of functional modules, the components of a receiver 22 according to an embodiment. The receiver 22 of FIG. 3b comprises a number of functional modules; a send and/or receive module 31a, a determine module 31b, and a perform module sic. The receiver 22 of FIG. 3b may further comprises a number of optional functional modules, such as any of an activate and/or deactivate module 31d. The functionality of each functional module 31a-d will be further disclosed below in the context of which the functional modules 31a-d may be used. In general terms, each functional module 31a-d may be implemented in hardware or in software. Preferably, one or more or all functional modules 31a-d may be implemented by the processing unit 31, possibly in cooperation with functional units 32 and/or 33. The processing unit 31 may thus be arranged to from the storage medium 33 fetch instructions as provided by a functional module 31a-d and to execute these instructions, thereby performing any steps as will be disclosed hereinafter.

The receiver 22 may be provided as a standalone device or as a part of a further device. For example, the receiver 22 may be provided in a radio transceiver device, such as a radio access network node 51 or a portable wireless device 61. The radio access network node 51 may be a base transceiver station (BTS), a Node B, an evolved node B (eNB), a repeater, a backhaul node, or the like. The wireless terminal 61 may be a user equipment (UE), a mobile phone, a tablet computer, a laptop computer, etc. or the like FIG. 2 illustrates a radio transceiver device 51, 61 comprising a receiver 22. According to FIG. 2 the radio transceiver device 51, 61 further comprises an antenna array 21, and a detector 23, and a receiver 22. The receiver 22 inter alia comprises the controller 28.

The receiver 22 may be provided as an integral part of the radio transceiver device 51, 61. That is, the components of the receiver 22 may be integrated with other components of the radio transceiver device 51, 61; some components of the radio transceiver device 51, 61 and the receiver 22 may be shared. For example, if the radio transceiver device 51, 61 as such comprises a processing unit, this processing unit may be arranged to perform the actions of the processing unit 31 associated with the receiver 22. Alternatively the receiver 22 may be provided as a separate unit in the radio transceiver device 51, 61.

Figure 4:
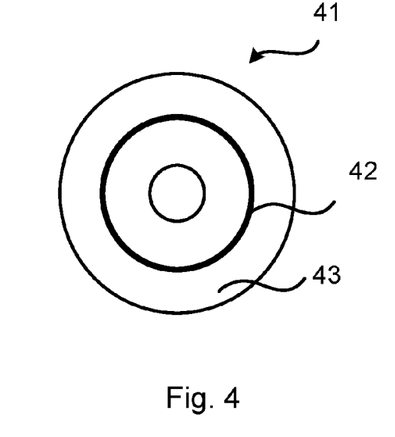
FIG. 4 shows one example of a computer program product comprising computer readable means according to an embodiment.

FIG. 4 shows one example of a computer program product 41 comprising computer readable means 43. On this computer readable means 43, a computer program 42 can be stored, which computer program 42 can cause the processing unit 31 and thereto operatively coupled entities and devices, such as the communications interface 32 and the storage medium 33, to execute methods according to embodiments described herein. The computer program 42 and/or computer program product 41 may thus provide means for performing any steps as herein disclosed.

In the example of FIG. 4, the computer program product 41 is illustrated as an optical disc, such as a CD (compact disc) or a DVD (digital versatile disc) or a Blu-Ray disc. The computer program product 41 could also be embodied as a memory, such as a random access memory (RAM), a read-only memory (ROM), an erasable programmable read-only memory (EPROM), or an electrically erasable programmable read-only memory (EEPROM) and more particularly as a non-volatile storage medium of a device in an external memory such as a USB (Universal Serial Bus) memory. Thus, while the computer program 42 is here schematically shown as a track on the depicted optical disk, the computer program 42 can be stored in any way which is suitable for the computer program product 41.

Figure 5:
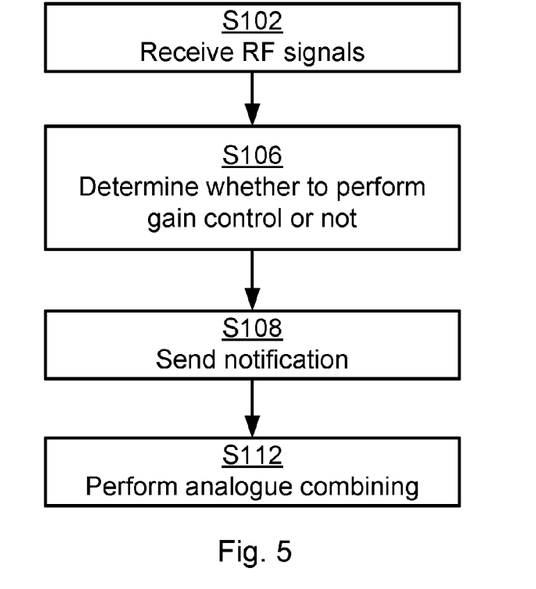
FIGS. 5, 6, and 7 are flowcharts of methods according to embodiments.
Figure 6:
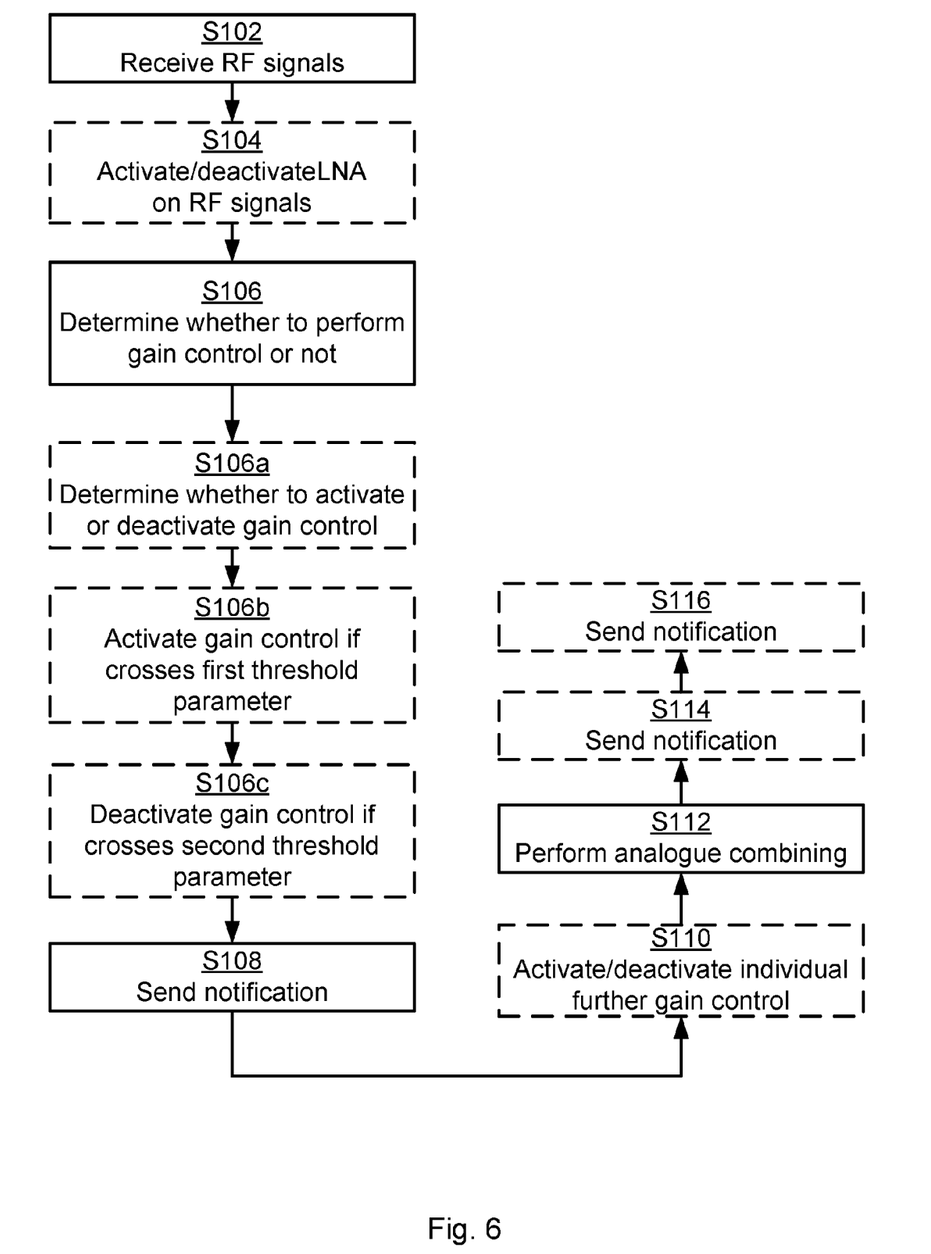
Figure 7:
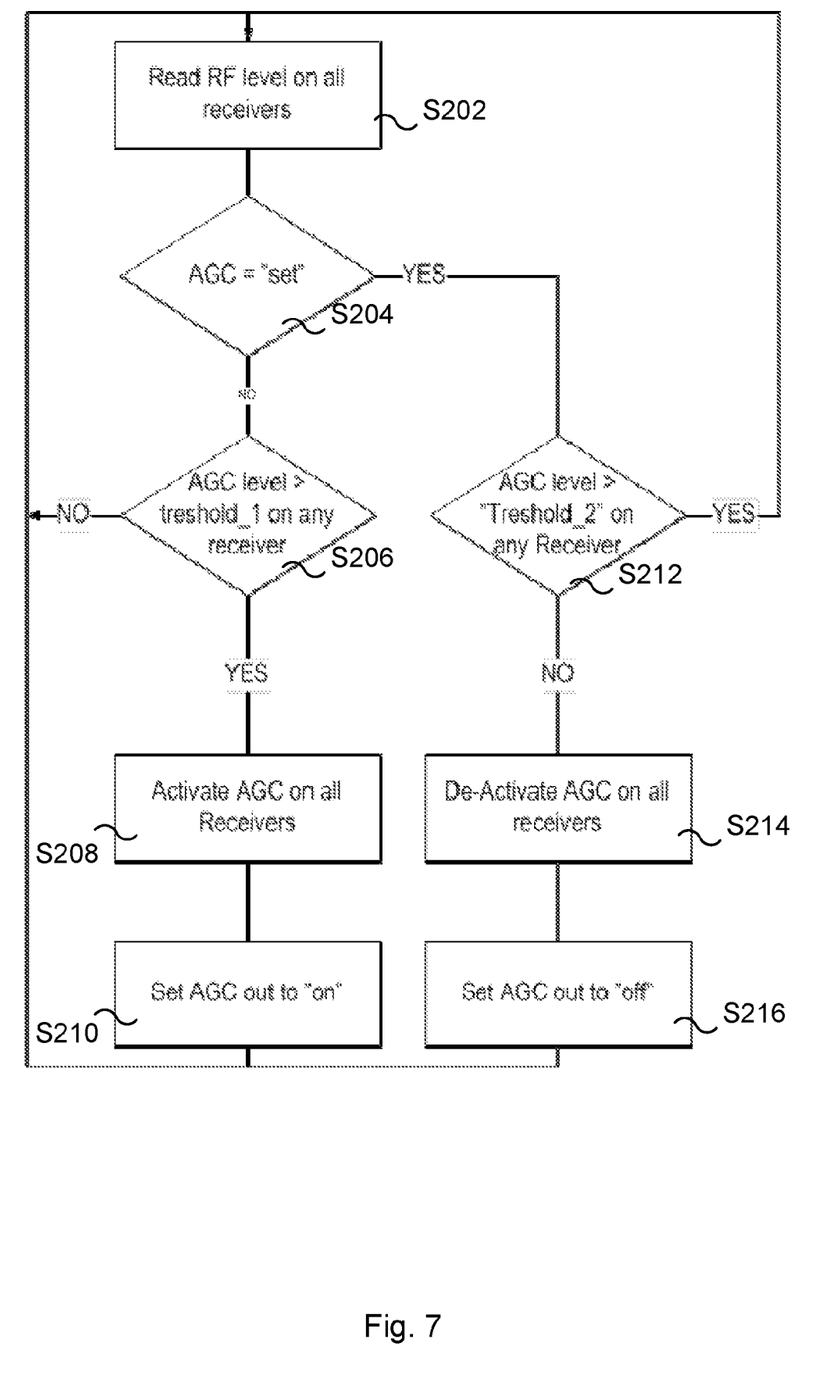

FIGS. 5, 6, and 7 are flow chart illustrating embodiments of methods for automatic gain control of radio chains of a receiver. The methods are performed by the receiver 22. The methods are advantageously provided as computer programs 42.

Reference is now made to FIG. 5 illustrating a method for automatic gain control of radio chains 24a, 24b, . . . , 24n of a receiver 22 as performed by the receiver 22 according to an embodiment.

S102: The receiver 22 receives at least two radio frequency (RF) signals. Each RF signal is received on an individual radio chain 24a, 24b, . . . , 24n from an antenna array 21. The processing unit 31 may be configured to perform step S102 by executing functionality of the functional module 31a. The computer program 42 and/or the computer program product 41 may thus provide means for this step.

S106: The receiver 22 determines whether to perform gain control or not of at least one of the at least two RF signals. The determination is in the receiver 22 performed by the controller 28. The processing unit 31 may be configured to perform step S106 by executing functionality of the functional module 31b. The computer program 42 and/or the computer program product 41 may thus provide means for this step. The gain control is to be performed before analogue combining of the at least two RF signals. The receiver 22 determines whether to perform gain control or not of at least one of the at least two RF signals by comparing the at least two RF signals to a threshold. Examples of how the at least two RF signals may be compared to the threshold as well as examples of the threshold will be provided below.

S108: The receiver 22, upon having determined whether to perform gain control or not of at least one of the at least two RF signals, sends a notification to a detector 23. The notification is in the receiver 22 sent by the controller 28. The processing unit 31 may be configured to perform step S108 by executing functionality of the functional module 31a. The computer program 42 and/or the computer program product 41 may thus provide means for this step. The notification regards whether gain control is performed or not.

S112: The receiver 22 performs analogue combining of the at least two RF signals. The analogue combining is in the receiver 22 performed by the analogue combiner 27. The processing unit 31 may be configured to perform step S112 by executing functionality of the functional module 31c. The computer program 42 and/or the computer program product 41 may thus provide means for this step. A single input to the detector 23 is generated by the analogue combining.

The gain control disclosed herein will improve performance of the antenna array 21 using analogue combining, thereby extending the dynamic range of the receiver 22. The receiver may thereby be enabled to receive signals from devices at varying distances to the antenna array 21. Further, this may enable the antenna array 21 to be suitable for antenna arrays 21 with many individual antenna elements, say about 100 or more antenna arrays simultaneously serving many tens of portable wireless devices 61 in the same coverage area, and for beam forming with fixed beams in different directions in the coverage area.

Reference is now made to FIG. 6 illustrating methods for automatic gain control of radio chains 24a, 24b, . . . , 24n of a receiver 22 as performed by the receiver 22 according to further embodiments.

There may be different ways to determine whether to perform gain control or not of at least one of the at least two RF signals. Different examples relating thereto will now be disclosed.

For example, the determination in step S106 may be based on one or more RF signals crossing the threshold, as in optional step S106a.

S106a: The receiver 22 may determine whether to perform gain control or not of at least one of the at least two RF signals by determining whether to activate or to deactivate performing gain control in case at least one individual RF signal of the at least two RF signals crosses the threshold. The determination is in the receiver 22 performed by the controller 28. The processing unit 31 may be configured to perform step S106a by executing functionality of the functional module 31b. The computer program 42 and/or the computer program product 41 may thus provide means for this step.

The receiver 22 may be configured to perform gain control of at least one of the at least two RF signals by activating or deactivating the gain control elements 29a, 29b, . . . , 29n. The activation/deactivation is in the receiver 22 performed by the controller 28. There may be different ways to perform the gain control of at least one of the at least two RF signals. Different examples relating thereto will now be disclosed.

For example, activating performing gain control may comprise subjecting at least one of the two RF signals to a gain value. For example, deactivating performing gain control may comprise stopping subjecting at least one of the two RF signals to a gain value. Hence (the controller 28 in) the receiver 22 may be configured to deactivate at least one of the gain control elements 29a, 29b, . . . , 29n.

Either a common gain value for all the at least two RF signals may be used or individual gain values for each one of the at least two RF signals may be used. Thus, as a first example, performing gain control may comprise subjecting all those of the at least two RF signals on which gain control is to be performed to a single gain value. Hence all the gain control elements 29a, 29b, . . . , 29n may have one single common gain value. Thus, as a second example, performing gain control may comprise subjecting each one of those of the at least two RF signals on which gain control is to be performed to an individual gain value. Hence at least two of the gain control elements 29a, 29b, . . . , 29n may have different gain values.

There may be different ways to determine the individual gain values to be used by the gain control elements 29a, 29b, . . . , 29n. For example, the individual gain values may depend on properties of the antenna array 21. More particularly, the individual gain values may depend on how antenna elements of the antenna array 21 are combined before low noise amplification.

Further, the gain control may be performed on all of the at least two RF signals or on less than all of the at least two RF signals. Hence, some of the gain control elements 29a, 29b, . . . , 29n may be activated whilst some of the gain control elements 29a, 29b, . . . , 29n may be deactivated.

There may be different ways to select the threshold. For example, the threshold may comprise a first threshold and a second threshold. The first threshold may be used for determining to activate gain control and the second threshold may be used for determining to deactivate gain control. The first threshold may be higher than the second threshold. Different examples relating thereto will now be disclosed.

For example, the determination in step S106 may further comprise comparing the at least two RF signals to a first threshold, as in optional step S106b. The comparing is in the receiver 22 performed by the controller 28.

S106b: The receiver 22 may activate gain control of at least one of the at least two RF signals in case at least one of the at least two RF signals exceeds a first threshold. The activation is in the receiver 22 performed by the controller 28. The processing unit 31 may be configured to perform step S106b by executing functionality of the functional module 31d. The computer program 42 and/or the computer program product 41 may thus provide means for this step. Step S106b may be performed in case gain control of at least one of the at least two RF signals currently is deactivated.

For example, the determination in step S106 may further comprise comparing the at least two RF signals to a second threshold, as in optional step S106c. The comparing is in the receiver 22 performed by the controller 28. The processing unit 31 may be configured to perform step S106c by executing functionality of the functional module 31d. The computer program 42 and/or the computer program product 41 may thus provide means for this step.

S106c: The receiver 22 may deactivate gain control of at least one of the at least two RF signals in case at least one of the at least two RF signals is less than a second threshold. The deactivation is in the receiver 22 performed by the controller 28. The processing unit 31 may be configured to perform step S106c by executing functionality of the functional module 31d. The computer program 42 and/or the computer program product 41 may thus provide means for this step. Step S106c may be performed in case gain control of at least one of the at least two RF signals currently is activated.

Figure 8:
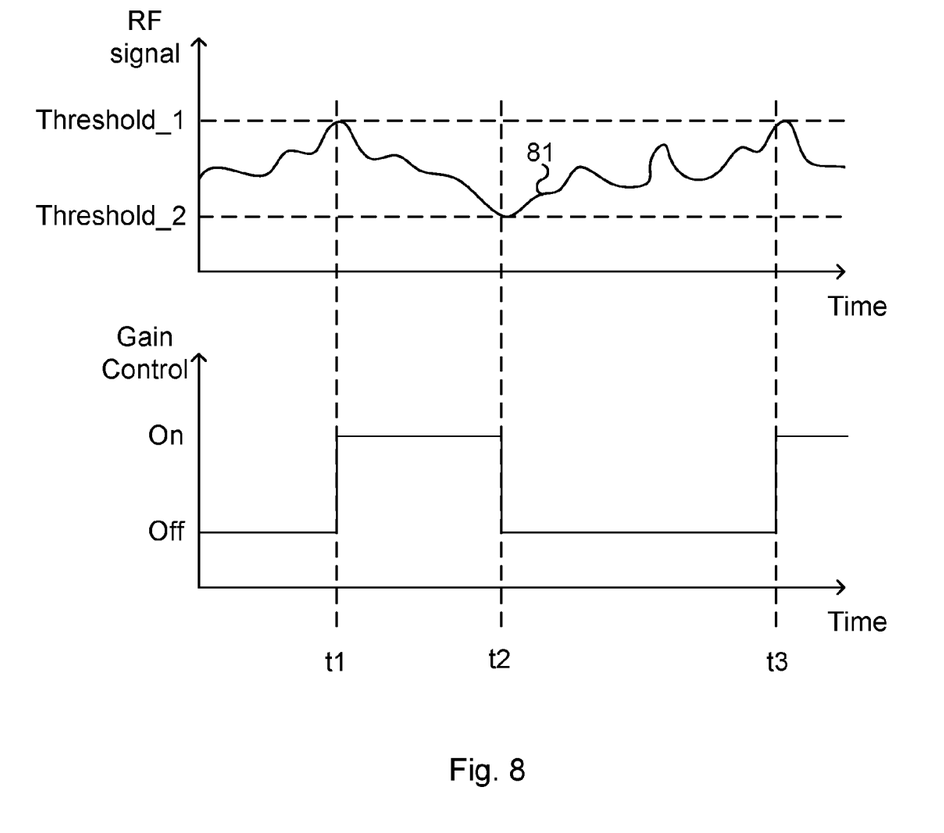
FIG. 8 schematically illustrates gain control of an RF signal according to an embodiment.

The upper part of FIG. 8 schematically illustrates an example of amplitude variation of an RF signal 81 of the at least two RF signals over time. The lower part of FIG. 8 schematically illustrates how gain control of at least one of the at least two RF signals is activated (in FIG. 8 illustrated by gain control being on) and deactivated (in FIG. 8 illustrated by gain control being off) based on the to behaviour of the RF signal 81. The activation and the deactivation of the gain control is based on comparing the RF signal 81 to a first threshold (in FIG. 8 denoted Threshold_1) and a second threshold (in FIG. 8 denoted Threshold_2), respectively. In the outset it is assumed that gain control is deactivated and hence not used. In the illustrative example of FIG. 8, at time t1 the RF signal 81 exceeds the first threshold and as a result thereof gain control is activated (i.e., in FIG. 8 gain control goes from being off to being on). Applying gain control on the RF signal 81 causes the amplitude of the RF signal 81 to sink below the first threshold. In the illustrative example of FIG. 8, at time t2 the RF signal 81 is less than the second threshold and as a result thereof gain control is deactivated (i.e., in FIG. 8 gain control goes from being on to being off). Removing application of gain control on the RF signal 81 causes the amplitude of the RF signal 81 to rise above the second threshold. In the illustrative example of FIG. 8, at time $t_3$ the RF signal 81 again exceeds the first threshold and as a result thereof gain control is again activated (i.e., in FIG. 8 gain control again goes from being off to being on). Applying gain control on the RF signal 81 causes the amplitude of the RF signal 81 to again sink below the first threshold.

Reference is again made to FIG. 6 illustrating methods for automatic gain control of radio chains 24a, 24b, . . . , 24n of a receiver 22.

The receiver 22 may be configured to send further notifications than the notification sent in step S108. The sending is in the receiver 22 performed by the controller 28. For example, such further notifications may relate to how many RF signal that crossed the threshold, and/or which RF signal(s) crossed the threshold, as in optional steps S114 and S116.

S114: The receiver 22 may send a notification regarding how many RF signals of the at least two RF signals that crosses the threshold. The processing unit 31 may be configured to perform step S114 by executing functionality of the functional module 31a. The computer program 42 and/or the computer program product 41 may thus provide means for this step.

S116: The receiver 22 may send a notification regarding which RF signals of to the at least two RF signals that crosses the threshold. The processing unit 31 may be configured to perform step S116 by executing functionality of the functional module 31a. The computer program 42 and/or the computer program product 41 may thus provide means for this step.

The receiver 22 may be configured to perform further operations of the RF signals, such as low noise amplification and/or further gain operations, as in optional steps S104 and S110.

S104: The receiver 22 may be configured to selectively activate/deactivate low noise amplification on the at least two RF signals before determining whether to perform gain control or not on the at least two RF signals. The processing unit 31 may be configured to perform step S104 by executing functionality of the functional module 31d. The computer program 42 and/or the computer program product 41 may thus provide means for this step. The low noise amplification is in the receiver 22 performed by the low noise amplifiers 25a, 25b, . . . , 25n.

S110: The receiver 22 may be configured to selectively activate/deactivate individual further gain operations on the at least two RF signals according to antenna beam weights after determining whether to perform gain control or not on the at least two RF signals. The selectively activating/deactivating is in the receiver 22 performed by the by the controller 28. The processing unit 31 may be configured to perform step S110 by executing functionality of the functional module 31d. The computer program 42 and/or the computer program product 41 may thus provide means for this step. The individual further gain operations is in the receiver 22 performed by the by the individual gain element 26a, 26b, . . . , 26n.

The individual further gain operations may be performed before performing the analogue combining, as in step S112. Hence, the individual further gain operations may be performed between the performing the gain control and performing the analogue combining.

Reference is now made to FIG. 7 illustrating a method for automatic gain control of radio chains 24a, 24b, . . . , 24n of a receiver 22 as performed by the receiver 22 according to a particular embodiment.

S202: The receiver 22 receives RF signals on individual radio chains 24a, 24b, . . . , 24n from an antenna array 21. Each RF signal in the radio chains is thereby continuously monitored by the receiver 22. One way of implementing step S202 is to perform step S102.

S204: It is checked whether gain control currently is activated (AGC="set"→Yes) or deactivated (AGC="set"→No). If gain control is activated step S212 is entered. If gain control is deactivated step S204 is entered.

S206: The receiver 22 compares the received RF signals to a first threshold (Threshold_1). If the received RF signal exceeds the first threshold step S208 is entered. If the received RF signal does not exceed the first threshold step S202 is entered. One way of implementing step S206 is to perform any of steps S106, S106a, and S106b.

S208: The receiver 22 activates gain control on all received RF signals. One way of implementing step S208 is to perform any of steps S106, S106a, and S106b.

S210: The receiver 22 sends a notification that gain control is activated (by setting "send notification"="on"). One way of implementing step S210 is to perform step S108.

S212: The receiver 22 compares the received RF signals to a second threshold (Threshold_2). If the received RF signal is lower than the second threshold step S214 is entered. If the received RF signal is not lower than the second threshold step S202 is entered. One way of implementing step S212 is to perform any of steps S106, S106a, and S106c.

S214: The receiver 22 deactivates gain control on all received RF signals. One way of implementing step S214 is to perform any of steps S106, S106a, and S106c.

S216: The receiver 22 sends a notification that gain control is deactivated (by setting "send notification"="off"). One way of implementing step S216 is to perform step S108.

Thus, according to the embodiment illustrated in FIG. 7 the controller 28 of the receiver 22 has two states; "AGC on" and "AGC off" (step S204). If the state is "AGC off" and if any of the RF signals are measured above Threshold_1 gain control is activated on all RF signals (step S208) and the controller 28 sets the notification signal "AGC out" to state "on" (step S210). In the "AGC on" state if any of the measured RF signal is below Threshold level_2 gain control is deactivated on all RF signals (step S214) and the controller 28 sets the notification signal "AGC off" to state "off" (step S216). In all other cases the state of the controller 28 remains unchanged.

The inventive concept has mainly been described above with reference to a few embodiments. However, as is readily appreciated by a person skilled in the art, other embodiments than the ones disclosed above are equally possible within the scope of the inventive concept, as defined by the appended patent claims.

The invention claimed is:

1. A method for automatic gain control of radio chains of a receiver, the method being performed by the receiver, the method comprising:
   receiving at least two radio frequency (RF) signals, each RF signal being received on an individual radio chain from an antenna array;
   determining, by comparing the at least two RF signals to a threshold, whether to perform gain control or not of at least one of the at least two RF signals before analog combining of the at least two RF signals;
   sending a notification to a detector regarding whether gain control is performed or not; and
   performing analog combining of the at least two RF signals, thereby generating a single input to the detector.

2. The method of claim 1, wherein said determining further comprises:
   determining whether to activate or to deactivate performing gain control in case at least one individual RF signal of the at least two RF signals crosses said threshold.

3. The method of claim 2, wherein activating performing gain control comprises subjecting at least one of the two RF signals to a gain value.

4. The method of claim 2, wherein deactivating performing gain control comprises stopping subjecting at least one of the two RF signals to a gain value.

5. The method of claim 1, wherein performing gain control comprises subjecting all those of the at least two RF signals on which gain control is to be performed to a single gain value.

6. The method of claim 1, wherein performing gain control comprises subjecting each one of those of the at least two RF signals on which gain control is to be performed to an individual gain value.

7. The method of claim 6, wherein said individual gain values depend on properties of the antenna array.

8. The method of claim 1, wherein performing gain control comprises performing gain control on less than all of the at least two RF signals.

9. The method of claim 1, wherein performing gain control comprises performing gain control on all of the at least two RF signals.

10. The method of claim 1, wherein said determining, in the event that gain control of at least one of the at least two RF signals is deactivated, further comprises:
    activating gain control of at least one of the at least two RF signals in the event that at least one of the at least two RF signals exceeds a first threshold.

11. The method of claim 1, wherein said determining, in the event that gain control of at least one of the at least two RF signals is activated, further comprises:
    deactivating gain control of at least one of the at least two RF signals in the event that at least one of the at least two RF signals is less than a second threshold.

12. The method of claim 10, wherein said determining, in the event that gain control of at least one of the at least two RF signals is activated, further comprises:
    deactivating gain control of at least one of the at least two RF signals in the event that at least one of the at least two RF signals is less than a second threshold, said first threshold being higher than said second threshold.

13. The method of claim 1, further comprising:
    sending a notification regarding how many RF signals of the at least two RF signals that crosses said threshold.

14. The method of claim 1, further comprising:
    sending a notification regarding which RF signals of the at least two RF signals that crosses said threshold.

15. The method of claim 1, further comprising:
    selectively activating and deactivating low noise amplification on the at least two RF signals before determining whether to perform gain control or not on the at least two RF signals.

16. The method of claim 1, further comprising:
    selectively activating and deactivating individual further gain operations on the at least two RF signals according to antenna beam weights after determining whether to perform gain control or not on the at least two RF signals.

17. The method of claim 16, wherein said individual further gain operations are performed before performing said analog combining.

18. The method of claim 16, wherein said individual further gain operations are performed during the analog combining of the at least two RF signals.

19. A receiver for automatic gain control of radio chains of the receiver, the receiver comprising a processing unit, the processing unit being configured to:
receive at least two radio frequency (RF) signals, each RF signal being received on an individual radio chain from an antenna array;
determine, by comparing the at least two RF signals to a threshold, whether to perform gain control or not of at least one of the at least two RF signals before analog combining of the at least two RF signals;
send a notification to a detector regarding whether gain control is performed or not; and
perform analog combining of the at least two RF signals, thereby generating a single input to the detector.

20. A radio access network node for automatic gain control of radio chains of a receiver of the radio access network node, the radio access network node comprising:
an antenna array;
a detector; and
a receiver of claim 19.

21. A portable wireless device for automatic gain control of radio chains of a receiver of the portable wireless device, the portable wireless device comprising:
an antenna array;
a detector; and
a receiver of claim 19.

22. A non-transitory computer-readable medium comprising, stored thereupon, a computer program for automatic gain control of radio chains of a receiver, the computer program comprising computer program code configured to, when run on a processing unit, cause the processing unit to:
receive at least two radio frequency (RF) signals, each RF signal being received on an individual radio chain from an antenna array;
determine, by comparing the at least two RF signals to a threshold, whether to perform gain control or not of at least one of the at least two RF signals before analog combining of the at least two RF signals;
send a notification to a detector regarding whether gain control is performed or not; and
perform analog combining of the at least two RF signals, thereby generating a single input to the detector.

* * * * *